US012610868B2

(12) United States Patent
Chen et al.

(10) Patent No.: US 12,610,868 B2
(45) Date of Patent: Apr. 21, 2026

(54) FAN-OUT STACKED SEMICONDUCTOR PACKAGE STRUCTURE AND PACKAGING METHOD THEREOF

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, Jiangyin City (CN)

( * ) Notice: Subject to any disclaimer, the term of this patent is extended or adjusted under 35 U.S.C. 154(b) by 468 days.

(21) Appl. No.: 18/132,571

(22) Filed: Apr. 10, 2023

(65) Prior Publication Data

US 2023/0352449 A1 Nov. 2, 2023

(30) Foreign Application Priority Data

Apr. 29, 2022 (CN) .......................... 202210474307.X

(51) Int. Cl.
*H01L 25/065* (2023.01)
*H01L 21/56* (2006.01)
(Continued)

(52) U.S. Cl.
CPC .......... *H01L 25/0657* (2013.01); *H01L 21/56* (2013.01); *H01L 23/296* (2013.01); *H01L 23/3128* (2013.01); *H01L 24/03* (2013.01); *H01L 24/05* (2013.01); *H01L 24/11* (2013.01); *H01L 24/13* (2013.01); *H01L 24/43* (2013.01); *H01L 24/45* (2013.01); *H10B 80/00* (2023.02); *H01L 2224/05124* (2013.01); *H01L 2224/05139* (2013.01); *H01L 2224/05144*

(2013.01); *H01L 2224/05147* (2013.01); *H01L 2224/13111* (2013.01); *H01L 2224/13139* (2013.01); *H01L 2224/13144* (2013.01);
(Continued)

(58) Field of Classification Search
CPC ................................................... H01L 25/0657
See application file for complete search history.

(56) References Cited

U.S. PATENT DOCUMENTS 9,318,442 B1 * 4/2016 Chen .................... H01L 23/5389
9,508,703 B2 * 11/2016 Yu ........................... H01L 24/09
(Continued)

*Primary Examiner* — William A Harriston
(74) *Attorney, Agent, or Firm* — IPRTOP LLC

(57) ABSTRACT

A fan-out stacked semiconductor package structure and a packaging method thereof are disclosed. The structure includes a three-dimensional memory chip package unit and a two-dimensional fan-out peripheral circuit chip SiP package unit. The three-dimensional memory chip package unit includes: at least two memory chips laminated in a stepped configuration; a first rewiring layer; wire bonding structures, each of which being electrically connected to the bonding pad and the first rewiring layer; a first encapsulating layer; and first metal bumps, formed on the first rewiring layer. The two-dimensional fan-out peripheral circuit chip SiP package unit includes: a second rewiring layer; at least one peripheral circuit chip; a third rewiring layer, bonded to the peripheral circuit chip; metal connection pillars; a second encapsulating layer, encapsulating the peripheral circuit chip and the metal connection pillars; and second metal bumps, formed on the second rewiring layer. The first metal bumps are bonded to the third rewiring layer.

12 Claims, 2 Drawing Sheets

(51) Int. Cl.

| | | |
|---|---|---|
| *H01L 23/00* | (2006.01) | |
| *H01L 23/29* | (2006.01) | |
| *H01L 23/31* | (2006.01) | |
| *H10B 80/00* | (2023.01) | |

(52) U.S. Cl.
CPC ............... *H01L 2224/13147* (2013.01); *H01L 2224/45144* (2013.01); *H01L 2224/45147* (2013.01); *H01L 2225/0651* (2013.01)

(56)                    References Cited

U.S. PATENT DOCUMENTS

| | | | | |
|---|---|---|---|---|
| 11,031,394 B1 * | 6/2021 | Or-Bach | ................. | G06F 30/39 |
| 11,545,458 B2 * | 1/2023 | Kim | ......................... | H01L 24/32 |
| 2016/0079220 A1 * | 3/2016 | Lin | .................... | H01L 25/0655 |
| | | | | 257/737 |
| 2016/0099231 A1 * | 4/2016 | Yang | .................. | H01L 23/3171 |
| | | | | 257/774 |
| 2017/0084583 A1 * | 3/2017 | Lin | ......................... | H01L 25/18 |
| 2020/0111738 A1 * | 4/2020 | Lee | ......................... | H01L 24/19 |
| 2022/0130798 A1 * | 4/2022 | Hong | ................. | H01L 25/0652 |
| 2022/0399260 A1 * | 12/2022 | Jeon | ...................... | H01L 25/105 |
| 2023/0253390 A1 * | 8/2023 | Sun | .................. | H01L 23/49822 |
| | | | | 257/659 |
| 2023/0326819 A1 * | 10/2023 | Chen | .................... | H01L 21/568 |
| 2023/0352449 A1 * | 11/2023 | Chen | ...................... | H01L 24/45 |
| 2024/0162130 A1 * | 5/2024 | Park | .................... | H01L 25/105 |
| 2024/0332252 A1 * | 10/2024 | Gandhi | .................. | H01L 24/73 |

* cited by examiner

1

FAN-OUT STACKED SEMICONDUCTOR PACKAGE STRUCTURE AND PACKAGING METHOD THEREOF

CROSS REFERENCE TO RELATED APPLICATION

The present application claims the benefit of priority to Chinese Patent Application No. CN 202210474307.X, entitled "FAN-OUT STACKED SEMICONDUCTOR PACKAGE STRUCTURE AND PACKAGING METHOD THEREOF", filed with CNIPA on Apr. 29, 2022, the disclosure of which is incorporated herein by reference in its entirety.

FIELD OF TECHNOLOGY

The present disclosure relates to the technical field of semiconductor packaging, and in particular, to a fan-out stacked semiconductor package structure and a packaging method thereof.

BACKGROUND

In traditional substrate manufacturing, the printed circuit boards (PCBs) are used to support electronic components, and are carriers for electrical connection of electronic components. In batch applications, the number of substrate layers is usually within 12. The more chip I/Os are, the more substrate layers will be needed and the higher the price will result in. The production process also has a certain limit. Currently, the minimum line width/line spacing have minumums 20 μm/20 μm, usually at above 50 μm/50 μm. As the front-end chip manufacturing has an increasingly higher integration level in functions, the future substrate technology will not be able to support the requirements of the front-end chip manufacturing. Therefore, different advanced packaging methods have been developed, such as 2.5D & fan-out wafer level advanced packaging technologies. However, these technologies are more expensive and take longer to manufacture than substrate manufacturing.

SUMMARY

The present disclosure provides a fan-out stacked semiconductor package structure, which includes: a three-dimensional memory chip package unit and a two-dimensional fan-out peripheral circuit chip system-in-package (SiP)package unit bonded to the three-dimensional memory chip package unit.

The three-dimensional memory chip package unit includes: at least two memory chips laminated in a stepped configuration, each of the at least two memory chips being provided with a bonding pad arranged on a step surface of the stepped configuration; a first rewiring layer having a first surface and a second surface, the first surface of the first rewiring layer being bonded to one of the at least two memory chips, and said memory chip being at a bottom step of the stepped configuration; wire bonding structures, one end of each of the wire bonding structures being electrically connected to the bonding pad of a corresponding memory chip and another end connecting to the first surface of the first rewiring layer; a first encapsulating layer, encapsulating the at least two memory chips, the wire bonding structures, and the first surface of the first rewiring layer; and first metal bumps, formed on the second surface of the first rewiring layer facing away from the at least two memory chip.

The two-dimensional fan-out peripheral circuit chip SiP package unit includes: a second rewiring layer having a first surface and a second surface; at least one peripheral circuit chip, arranged in two dimensions and connected with the first surface of the second rewiring layer; a third rewiring layer having a first surface and a second surface, the second surface of the third rewiring layer being bonded to the at least one peripheral circuit chip; metal connection pillars, provided on an outer side of the at least one peripheral circuit chip, each of the metal connection pillars having one end connected with the first surface of the second rewiring layer and another end connected with the second surface of the third rewiring layer, respectively; a second encapsulating layer, encapsulating the at least one peripheral circuit chip, the first surface of the second rewiring layer, and the metal connection pillars; and second metal bumps, formed on the second surface of the second rewiring layer.

The first metal bumps are bonded to the first surface of the third rewiring layer, to achieve bonding of the three-dimensional memory chip package unit to the two-dimensional fan-out peripheral circuit chip SiP package unit.

The present disclosure further provides a method of packaging a fan-out stacked semiconductor package structure, which includes: forming a three-dimensional memory chip package unit and a two-dimensional fan-out peripheral circuit chip system-in-package (SiP) package unit.

The forming of the three-dimensional memory chip package unit includes: forming the stepped configuration; forming at least two memory chips laminated in the stepped configuration, each of the at least two memory chips including a bonding pad arranged on a step surface of the stepped configuration; forming a first rewiring layer, which has a first surface and a second surface, the first surface of the first rewiring layer being bonded to one of the at least two memory chips, and said memory chip being at a bottom step of the stepped configuration; forming wire bonding structures, one end of each of the wire bonding structures being electrically connected to the bonding pad of a corresponding memory chip and another end connecting to the first surface of the first rewiring layer; forming a first encapsulating layer, which encapsulates the at least two memory chips, the wire bonding structures, and the first surface of the first rewiring layer; and forming first metal bumps on the second surface of the first rewiring layer facing away from the at least two memory chips.

The forming of the two-dimensional fan-out peripheral circuit chip SiP package unit includes: forming a second rewiring layer which has a first surface and a second surface; providing at least one peripheral circuit chip in a two dimensional arrangement and connecting the at least one peripheral circuit chip with the first surface of the second rewiring layer; forming a third rewiring layer which has a first surface and a second surface, the second surface of the third rewiring layer being bonded to the at least one peripheral circuit chip; forming metal connection pillars on an outer side of the at least one peripheral circuit chip, each of the metal connection pillars having one end connected with the first surface of the second rewiring layer and another end connected with the second surface of the third rewiring layer, respectively; forming a second encapsulating layer, which encapsulates the at least one peripheral circuit chip, the first surface of the second rewiring layer, and the metal connection pillars; forming second metal bumps on the second surface of the second rewiring layer.

The method of packaging the fan-out stacked semiconductor package structure further includes interconnecting the three-dimensional memory chip package unit with the two-dimensional fan-out peripheral circuit chip SiP package unit by bonding the first metal bumps to the first surface of the third rewiring layer.

As mentioned above, the fan-out stacked semiconductor package structure and the packaging method thereof according to the present disclosure adopts a fan-out pattern and realizes a package on package (POP) structure by rewiring layers in which a three-dimensional memory chip package unit and a two-dimensional fan-out peripheral circuit chip SiP package unit are bonded, thereby obtaining a memory-encapsulated POP structure. In addition, the memory chip can be electrically connected to the rewiring layers by a wire bonding method, and the entire package structure does not require TSV holes for circuit lead-out, which eliminates the circuit substrate required for traditional electronic component packaging, allows for high-density and high-integration device packaging, and enables the minimum line width/line spacing to be reduced to 1.5 µm/1.5 µm. The process time can be shortened, and the efficiency is high. Further, the thickness of the package structure can be significantly reduced. Finally, it is possible to realize a one-stop packaging process in which substrate is replaced from the middle-end-of-line (MEOL) to the back-end-of-line (BEOL).

DESCRIPTION OF REFERENCE NUMERALS

Figure 1:
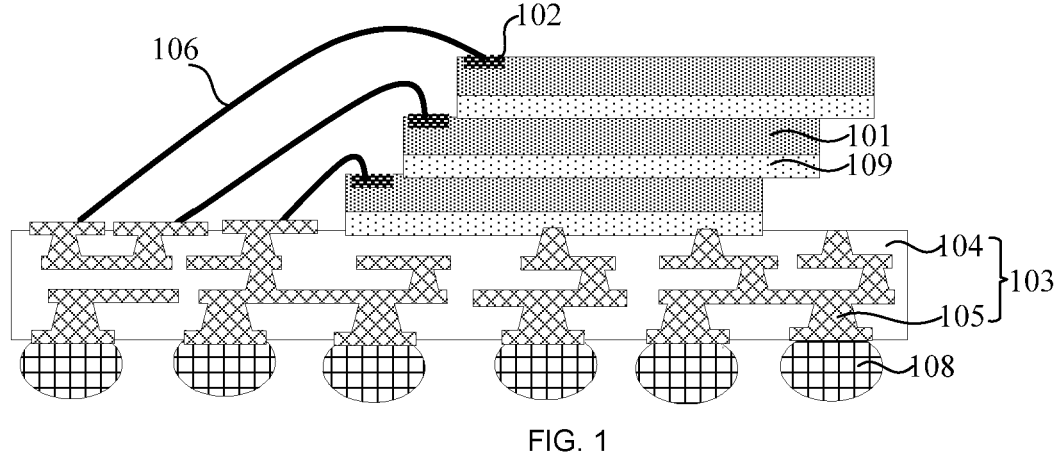
FIG. 1 shows a schematic diagram of a three-dimensional memory chip package unit of a fan-out stacked semiconductor package structure before encapsulation according to the present disclosure.

10 Three-dimensional memory chip package unit
101 Memory chip
102 Bonding pad
103 First rewiring layer
104 Dielectric layer
105 Metal wiring layer
106 Wire bonding structure
107 First encapsulating layer
108 First metal bump
109 Bonding layer
20 Two-dimensional fan-out peripheral circuit chip SiP package unit
201 Second rewiring layer
202 Peripheral circuit chip
203 Third rewiring layer
204 Second encapsulating layer
205 Second metal bump
206 Metal connection pillar
207 Bottom filler layer
208 Bonding layer

DETAILED DESCRIPTION

The embodiments of the present disclosure will be described below. Those skilled in the art can easily understand other advantages and effects of the present disclosure according to the contents disclosed by the specification. The present disclosure may also be implemented or applied through other different specific implementation modes. Various modifications or changes may be made to all details in the specification based on different points of view and applications without departing from the spirit of the present disclosure.

Please refer to FIGS. 1-4. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be changed according to actual needs, and the component layout configuration thereof may be more complicated.

Embodiment 1

Figure 2:
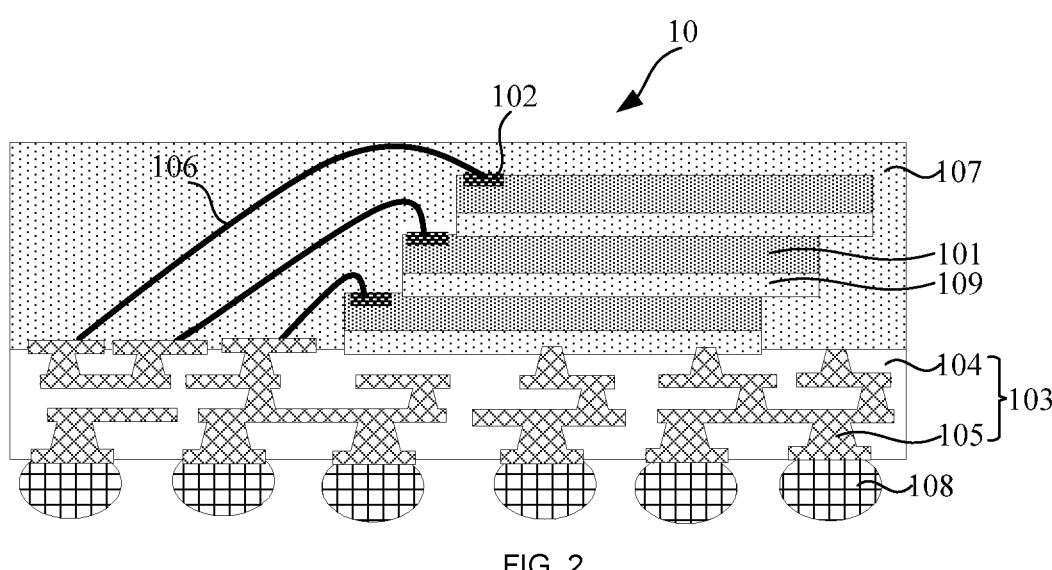
FIG. 2 shows a schematic diagram of the three-dimensional memory chip package unit in the fan-out stacked semiconductor package structure after encapsulation according to the present disclosure.
Figure 3:
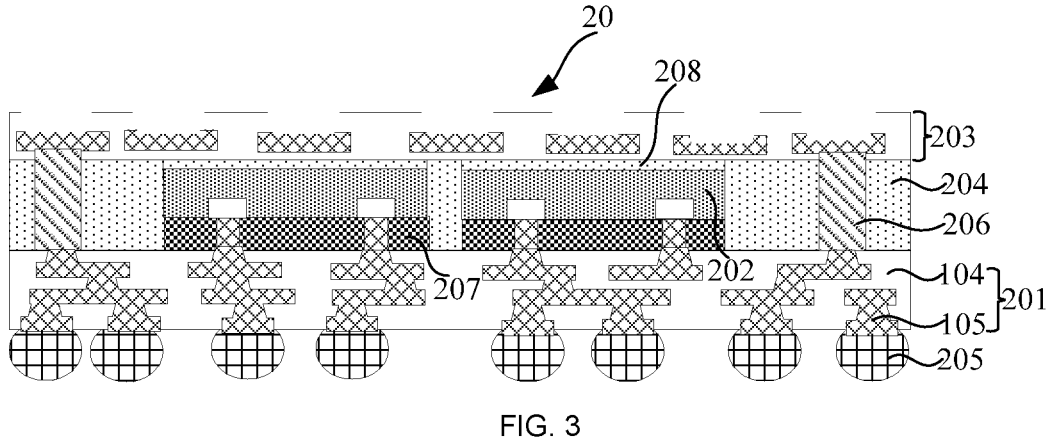
FIG. 3 shows a schematic diagram of the two-dimensional fan-out peripheral circuit chip SiP package unit of the fan-out stacked semiconductor package structure according to the present disclosure.
Figure 4:
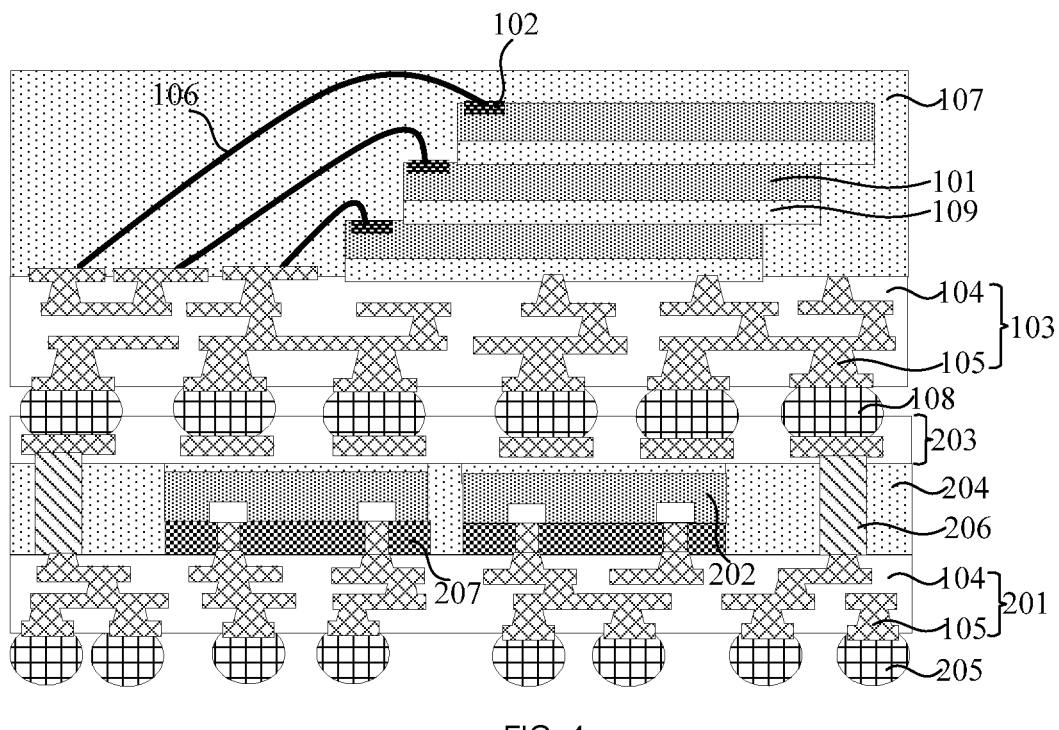
FIG. 4 shows a schematic diagram of the fan-out stacked semiconductor package structure according to the present disclosure.

As shown in FIGS. 2-4, a fan-out stacked semiconductor package structure is provided, which includes: a three-dimensional memory chip package unit 10, and a two-dimensional fan-out peripheral circuit chip system-in-package (SiP) package unit 20 bonded to the three-dimensional memory chip package unit 10.

As shown in FIG. 2, the three-dimensional memory chip package unit 10 includes: at least two memory chips 101 laminated in a stepped configuration, each of the at least two memory chips 101 being provided with a bonding pad 102 arranged on a step surface of the stepped configuration; a first rewiring layer 103, which is bonded to the memory chip 101 at a bottom step of the stepped configuration; wire bonding structures 106, each of which being electrically connected to the bonding pad 102 of the corresponding memory chip 101 and the first rewiring layer 103, to electrically connect the at least two memory chips 10 to the first rewiring layer 103; a first encapsulating layer 107, encapsulating the at least two memory chips 101 and the wire bonding structures 106; and first metal bumps 108, formed on the first rewiring layer 103.

As shown in FIG. 3, the two-dimensional fan-out peripheral circuit chip SiP package unit 20 includes: a second rewiring layer 201; at least one peripheral circuit chip 202, arranged in two dimensions and electrically connected with the second rewiring layer 201; a third rewiring layer 203, bonded to the at least one peripheral circuit chip 202; metal connection pillars 206, provided on an outer side of the at least one peripheral circuit chip 202, and electrically connected with the second rewiring layer 201 and the third rewiring layer 203, respectively; a second encapsulating layer 204, encapsulating the at least one peripheral circuit chip 202 and the metal connection pillars 206; and second metal bumps 205, formed on the second rewiring layer 201. The metal connection pillars 206 connecting the second rewiring layer 201 and the third rewiring layer 203 may apply the wire bonding technique.

As shown in FIG. 4, the first metal bumps 108 are bonded to the third rewiring layer 203 to achieve bonding of the three-dimensional memory chip package unit 10 to the two-dimensional fan-out peripheral circuit chip SiP package unit 20.

The fan-out stacked semiconductor package structure provided in this Embodiment adopts a fan-out pattern and realizes a package on package (POP) structure by rewiring layers in which a three-dimensional memory chip package unit 10 and a two-dimensional fan-out peripheral circuit chip SiP package unit 20 are bonded, thereby obtaining a memory-encapsulated POP structure. In addition, the memory chip can be electrically connected to the rewiring layer by a wire bonding method, and the entire package structure does not require TSV holes for circuit lead-out, which eliminates the circuit substrate required for traditional electronic component packaging, allows for high-density and high-integration device packaging, and enables the minimum line width/line spacing to be reduced to 1.5 μm/1.5 μm. The process time can be shortened, and the efficiency is high. Further, the thickness of the package structure can be significantly reduced. Finally, it is possible to realize a one-stop packaging process in which substrate is replaced from the middle-end-of-line (MEOL) to the back-end-of-line (BEOL).

The memory chip 101 can be any existing memory chip suitable for three-dimensional lamination, such as DRAM, SRAM, flash memory, EEPROM, PRAM, MRAM and RPAM. In addition, the functions of the memory chips 101 in each layer of the laminated memory chips in the stepped configuration may be the same or different, the size of the memory chips 101 in each layer may be the same or different, and the size of the step surface of the memory chips 101 in each layer can be the same or different. The above parameters may be set according to the specific requirements of the package structure. The peripheral circuit chip 202 is mainly used to drive and control the memory chip 101. The peripheral circuit chip 202 may include peripheral circuit transistors and peripheral logic circuits. The peripheral logic circuits may include, but are not limited to, static random access memory (SRAM), phase-locked loop (PLL), central processing unit (CPU), field programmable gate array (FPGA), etc. The design of the peripheral logic circuits depends on the different chips and functions.

As shown in FIG. 3, the metal connection pillar 206 serves as an electrical connection conduit between the second rewiring layer 201 and the third rewiring layer 203, to lead out the signal of the peripheral circuit chip 202. In practice, the metal connection pillars 206 connecting the second rewiring layer 201 and the third rewiring layer 203 may apply the wire bonding technique if necessary.

The material of the metal connection pillar 206 may have good conductivity and is not easily diffused, such as at least one of gold, silver, aluminum, copper. However, the material of the metal connection pillar 206 is not limited to the above-mentioned, other materials having good conductivity are also available.

As shown in FIGS. 1 and 2, the material of the bonding pad 102 on each memory chip 101 includes metallic aluminum, i.e., the bonding pad 102 is an aluminum bonding pad. When preparing the bonding pad 102, an adhesive layer may be formed under the bonding pad 102, and an anti-reflection layer may be formed on the bonding pad 102, in order to improve electrical properties of the bonding pad and enhance the bonding between the bonding pad and the memory chip 101.

As shown in FIGS. 1 and 2, the wire bonding structure 106 is used to electrically connect the at least two memory chips 10 to the first rewiring layer 103. The material of the wire bonding structure 106 is selected from metallic materials with good electrical conductivity and are easy to deform, such as one of Cu wire, Au wire, Cu alloy wire, Au alloy wire, and Cu/Au alloy wire.

As shown in FIG. 4, as an example, the material of the first encapsulating layer 107 includes one of polyimide, silicone, and epoxy resin; similarly, the material of the second encapsulating layer 204 includes one of polyimide, silicone, and epoxy resin. Top surfaces of the first encapsulating layer 107 and the second encapsulating layer 204 are both ground or polished flat surfaces, to improve the quality of the subsequently formed rewiring layers and the quality of the package body.

As shown in FIGS. 1-4, the first rewiring layer 103, the second rewiring layer 201, and the third rewiring layer 203 each includes a dielectric layer 104 and a metal wiring layer 105. The material of the dielectric layer 104 includes one or a combination of two or more of epoxy resin, silicone rubber, polyimide (PI), polybenzoxazole (PBO), benzocyclobutene (BCB), silicon oxide, phosphorosilicate glass, and fluorine-containing glass. The material of the metal wiring layer 105 includes one or a combination of two or more of copper, aluminum, nickel, gold, silver, and titanium. It should be noted here that although the first rewiring layer 103, the second rewiring layer 201, and the third rewiring layer 203 each includes a dielectric layer 104 and a metal wiring layer 105, the material, number of layers and distribution shape of the rewiring layers at different locations will be set according to actual needs and are not limited herein.

As shown in FIGS. 1-4, the first metal bump 108 or the second metal bump 205 may include one of a gold-tin solder ball, a silver-tin solder ball, and a copper-tin solder ball. Alternatively, the first metal bump 108 or the second metal bump 205 may include a metal pillar and a solder ball formed on the metal pillar. Preferably, the metal pillar is a copper pillar or a nickel pillar. In this embodiment, the first metal bump 108 and the second metal bump 205 are in the form of gold-tin solder balls, the manufacturing steps of which include: first forming a gold-tin layer, then using a high-temperature reflow process to reflow the gold-tin layer into a ball, and then forming a gold-tin solder ball after cooling down; or using a bumping process to form a gold-tin solder ball.

Embodiment 2

As shown in FIGS. 1-4, this embodiment provides a method of packaging a fan-out stacked semiconductor package structure. The fan-out stacked semiconductor package structure of Embodiment 1 can be prepared using the packaging method of this embodiment. However, the fan-out stacked semiconductor package structure of Embodiment 1 can also be prepared using other packaging methods.

Specifically, FIGS. 1-4 show a schematic diagram of the structure presented in each step of the packaging method of the fan-out stacked semiconductor package structure according to this embodiment.

As shown in FIGS. 1-3, step S1 is first performed to provide a three-dimensional memory chip package unit 10 and a two-dimensional fan-out peripheral circuit chip SiP package unit 20. As shown in FIG. 2, the three-dimensional memory chip package unit 10 includes: at least two memory chips 101 laminated in a stepped configuration, each of the at least two memory chips 101 being provided with a bonding pad 102 arranged on a step surface of the stepped configuration; a first rewiring layer 103, which is bonded to the memory chip 101 at a bottom step of the stepped configuration; wire bonding structures 106, each of which being electrically connected to the bonding pad 102 of the corresponding memory chip 101 and the first rewiring layer 103; a first encapsulating layer 107, encapsulating the at least two memory chips 101 and the wire bonding structures 106; and first metal bumps 108, formed on the first rewiring layer 103. As shown in FIG. 3, the two-dimensional fan-out peripheral circuit chip SiP package unit 20 includes: a second rewiring layer 201; at least one peripheral circuit chip 202, arranged in two dimensions and electrically connected with the second rewiring layer 201; a third rewiring layer 203, bonded to the at least one peripheral circuit chip 202; metal connection pillars 206, provided on an outer side of the at least one peripheral circuit chip 202, and electrically connected with the second rewiring layer 201 and the third rewiring layer 203, respectively; the metal connection pillars 206 connecting the second rewiring layer 201 and the third rewiring layer 203, or the connection between the third rewiring layer 203 and the at least one peripheral circuit chip 202 may apply the wire bonding technique; a second encapsulating layer 204, encapsulating the at least one peripheral circuit chip 202 and the metal connection pillars 206; and second metal bumps 205, formed on the second rewiring layer 201.

As shown in FIGS. 1-2, as a specific example, the method of forming the three-dimensional memory chip package unit 10 includes: forming the first rewiring layer 103; sequentially laminating and bonding the at least two memory chips 101 on the first rewiring layer 103, such that the at least two memory chips 101 are laminated in a stepped configuration, where the bonding of the at least two memory chips 101 may be realized by bonding layers 109 using a surface mount process, and the bonding process may include forming a bonding layer 109 on a surface of the first rewiring layer 103 and then bonding a memory chip 101 to the bonding layer 109, or forming a bonding layer 109 on a surface of a memory chip 101 at a lower step of the stepped configuration and then bonding a memory chip 101 at a upper step of the stepped configuration to the bonding layer 109; performing wire bonding between the bonding pad 102 on each memory chip 101 and the first rewiring layer 103, to form the wire bonding structures 106, where the wire bonding structures 106 may be formed by conventional wire bonding processes, and the length, thickness, bending form and other parameters of the wire bonding structure 106 connecting each layer of memory chip 101 to the first rewiring layer 103 may be set according to the actual needs, as long as the electrical connection effect can be achieved without crosstalk; forming the first metal bumps 108 on the first rewiring layer 103, where the first metal bumps 108 are gold-tin solder balls, and the gold-tin solder balls may be formed by firstly forming a gold-tin layer on a surface of the first rewiring layer 103, and then using a high-temperature reflow process to reflow the gold-tin layer into a ball, and finally forming a gold-tin solder ball after cooling down, or by using a bumping process; and encapsulating the at least two memory chips 101 and the wire bonding structures 106 by the first encapsulating layer 107, where the encapsulating method may include molding by method of compression molding, transfer molding, hydraulic molding, vacuum lamination or spin coating, and then grinding or polishing the encapsulation surface after the molding to make the surface of the encapsulation layer smooth and improve the quality.

As another specific example, the forming of the first rewiring layer 103 may include the following steps: first forming a dielectric layer using a chemical vapor deposition process or a physical vapor deposition process, and etching the dielectric layer to form a patterned dielectric layer; then forming a metal wiring layer on a surface of the patterned dielectric layer using a chemical vapor deposition process, a physical vapor deposition process, a sputtering process, an electroplating process, or a chemical plating process, and etching the metal wiring layer to form a patterned metal wiring layer. It should be noted here that the material, number of layers and distribution shape of the dielectric layer 104 and the metal wiring layer 105 can be set according to the specific conditions of different memory chips and will not be limited here.

As shown in FIG. 3, as a specific example, the method of forming the two-dimensional fan-out peripheral circuit chip SiP package unit 20 includes: forming the second rewiring layer 201; electrically connecting the at least one peripheral circuit chip 202 arranged in two dimensions to the second rewiring layer 201; electrically connecting the metal connection pillars 206 to the second rewiring layer 201, where the metal connection pillars 206 are formed on an outer side of the at least one peripheral circuit chip 202; encapsulating the at least one peripheral circuit chip 202 and the metal connection pillars 206 using the second encapsulating layer 204; forming the third rewiring layer 203 on the at least one peripheral circuit chip 202 and the metal connection pillars 206, where the third rewiring layer 203 is bonded to the at least one peripheral circuit chip 202, and the metal connection pillars 206 are electrically connected with the third rewiring layer 203; and forming the second metal bumps 205 on the second rewiring layer 201. The metal connection pillars 206 connecting the second rewiring layer 201 and the third rewiring layer 203, or the connection between the third rewiring layer 203 and the at least one peripheral circuit chip 202 may apply the wire bonding technique. A bottom filler layer 207 may be provided between the at least one peripheral circuit chip 202 and the second rewiring layer 201, to improve the bond strength between the two and to protect the second rewiring layer 201. The at least one peripheral circuit chip 202 may be bonded to the third rewiring layer 203 by a bonding layer 208.

As an example, the method of forming the second rewiring layer 201 and the third rewiring layer 203 can be referred to the method of forming the first rewiring layer 103 above and will not be repeated herein.

As shown in FIG. 4, step S2 is then performed to bond the first metal bumps 108 to the third rewiring layer 203 to achieve bonding of the three-dimensional memory chip package unit 10 to the two-dimensional fan-out peripheral circuit chip SiP package unit 20, so as to obtain the fan-out stacked semiconductor package structure of the present disclosure.

In summary, the fan-out stacked semiconductor package structure and the packaging method thereof according to the present disclosure adopts a fan-out pattern and realizes a package on package (POP) structure by rewiring layers in which a three-dimensional memory chip package unit and a two-dimensional fan-out peripheral circuit chip SiP package unit are bonded, thereby obtaining a memory-encapsulated POP structure. In addition, the memory chip can be electrically connected to the rewiring layers by a wire bonding method, and the entire package structure does not require TSV holes for circuit lead-out, which eliminates the circuit substrate required for traditional electronic component packaging, allows for high-density and high-integration device packaging, and enables the minimum line width/line spacing to be reduced to 1.5 μm/1.5 μm. The process time can be shortened, and the efficiency is high. Further, the thickness of the package structure can be significantly reduced. Finally, it is possible to realize a one-stop packaging process in which substrate is replaced from the middle-end-of-line (MEOL) to the back-end-of-line (BEOL). Therefore, the present disclosure effectively overcomes various shortcomings in the existing technology and has high industrial utilization value.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

What is claimed is:

1. A fan-out stacked semiconductor package structure, comprising:

a three-dimensional memory chip package unit and a two-dimensional fan-out peripheral circuit chip system-in-package (SIP) package unit bonded to the three-dimensional memory chip package unit;

wherein the three-dimensional memory chip package unit comprises:

a first memory chip and a second memory chip laminated in a stepped configuration, wherein the first memory chip and a first bonding layer under the first memory chip are stacked on a bottom step of the stepped configuration, and the second memory chip and a second bonding layer under the second memory chip are stacked on a second step of the stepped configuration, wherein the second step is arranged to be above and retreated from the bottom step of the stepped configuration; wherein a first bonding pad is arranged on a surface of the first memory chip and a second bonding pad is arranged on a surface of the second memory chip on the stepped configuration;

a first rewiring layer having a first surface and a second surface, wherein the first surface of the first rewiring layer is bonded to the first bonding layer of the bottom step of the stepped configuration;

a first wire bonding structure and a second wire bonding structure, wherein one end of the first wire bonding structure is electrically connected to the first bonding pad of the first memory chip and another end connects to the first surface of the first rewiring layer, and wherein one end of the second wire bonding structure is electrically connected to the second bonding pad of the second memory chip and another end connects to the first surface of the first rewiring layer, a first encapsulating layer, encapsulating the first memory chip and the second memory chip, the first and the second wire bonding structures, and the first surface of the first rewiring layer, and first metal bumps, formed on the second surface of the first rewiring layer facing away from the first memory chip and the second memory chip;

wherein the two-dimensional fan-out peripheral circuit chip SiP package unit comprises:

a second rewiring layer having a first surface and a second surface;

at least one peripheral circuit chip, arranged in two dimensions and connected with the first surface of the second rewiring layer;

a third rewiring layer having a first surface and a second surface, wherein the second surface of the third rewiring layer is bonded to the at least one peripheral circuit chip;

metal connection pillars, provided on an outer side of the at least one peripheral circuit chip, wherein each of the metal connection pillars has one end connected with the first surface of the second rewiring layer and another end connected with the second surface of the third rewiring layer, respectively;

a second encapsulating layer, encapsulating the at least one peripheral circuit chip, the first surface of the second rewiring layer, and the metal connection pillars; and second metal bumps, formed on the second surface of the second rewiring layer, and wherein the first metal bumps are bonded to the first surface of the third rewiring layer, to achieve bonding of the three-dimensional memory chip package unit to the two-dimensional fan-out peripheral circuit chip SIP package unit.

2. The fan-out stacked semiconductor package structure according to claim 1, wherein a material of the metal connection pillars comprises at least one of gold, silver, aluminum, and copper.

3. The fan-out stacked semiconductor package structure according to claim 1, wherein a material of the first and second bonding pads comprises metallic aluminum.

4. The fan-out stacked semiconductor package structure according to claim 1, wherein a material of the first and second wire bonding structures comprises gold or copper; wherein a material of the first encapsulating layer comprises one of polyimide, silicone, and epoxy resin; and wherein a material of the second encapsulating layer comprises one of polyimide, silicone, and epoxy resin.

5. The fan-out stacked semiconductor package structure according to claim 1, wherein each of the first rewiring layer, the second rewiring layer, and the third rewiring layer includes a dielectric layer and a metal wiring layer, wherein a material of the dielectric layer includes one or a combination of two or more of epoxy resin, silicone, polyimide (PI), polybenzoxazole (PBO), benzocyclobutene (BCB), silicon oxide, phosphorosilicate glass, and fluorine-containing glass, and wherein a material of the metal wiring layer includes one or a combination of two or more of copper, aluminum, nickel, gold, silver, and titanium.

6. The fan-out stacked semiconductor package structure according to claim 1, wherein one of the first metal bumps or one of the second metal bumps comprises a connecting structure, wherein the connecting structure comprises a solder ball, or a metal pillar and a solder ball formed on the metal pillar, wherein the solder ball comprises one of a gold-tin solder ball, a silver-tin solder ball, and a copper-tin solder ball.

7. The fan-out stacked semiconductor package structure according to claim 1, wherein the three-dimensional memory chip package unit further comprises:

a third memory chip in the stepped configuration, wherein the third memory chip and a third bonding layer under the third memory chip are stacked on a third step of the stepped configuration, wherein the third step is arranged to be above and retreated from the second step of the stepped configuration; and a third wire bonding structure, wherein one end of the third wire bonding structure is electrically connected to a third bonding pad on the third memory chip and another end connects to the first surface of the first rewiring layer, wherein the first encapsulating layer further encapsulates the third memory chip and the third wire bonding structure.

8. A method of packaging a fan-out stacked semiconductor package structure, comprising:

forming a three-dimensional memory chip package unit and a two-dimensional fan-out peripheral circuit chip system-in-package (SiP) package unit;

wherein forming the three-dimensional memory chip package unit comprises:

forming a stepped configuration;

forming a first memory chip and a first bonding layer under the first memory chip stacked on a bottom step of the stepped configuration, forming a second memory chip and a second bonding layer under the second memory chip stacked on a second step of the stepped configuration, wherein the second step is arranged to be above and retreated from the bottom step of the stepped configuration, wherein a first bonding pad is arranged on a surface of the first memory chip and a second bonding pad is arranged on a surface of the second memory chip on the stepped configuration;

forming a first rewiring layer, which has a first surface and a second surface, wherein the first surface of the first rewiring layer is bonded to the first bonding layer on the bottom step of the stepped configuration;

forming a first wire bonding structure and a second wire bonding structure, wherein one end of the first wire bonding structure is electrically connected to the first bonding pad of the first memory chip and another end connects to the first surface of the first rewiring layer, and wherein one end of the second wire bonding structure is electrically connected to the second bonding pad of the second memory chip and another end connects to the first surface of the first rewiring layer;

forming a first encapsulating layer, which encapsulates the first memory chip and the second memory chip, the first wire bonding structure and the second wire bonding structure, and the first surface of the first rewiring layer; and forming first metal bumps on the second surface of the first rewiring layer facing away from the first memory chip and the second memory chip;

wherein forming the two-dimensional fan-out peripheral circuit chip SIP package unit comprises:

forming a second rewiring layer which has a first surface and a second surface;

providing at least one peripheral circuit chip in a two dimensional arrangement and connecting the at least one peripheral circuit chip with the first surface of the second rewiring layer;

forming metal connection pillars on an outer side of the at least one peripheral circuit chip, wherein each of the metal connection pillars has one end connected with the first surface of the second rewiring layer;

forming a third rewiring layer which has a first surface and a second surface, bonding the second surface of the third rewiring layer to the at least one peripheral circuit chip and another end of each of the metal connection pillars;

forming a second encapsulating layer, which encapsulates the at least one peripheral circuit chip, the first surface of the second rewiring layer, and the metal connection pillars;

forming second metal bumps on the second surface of the second rewiring layer, and interconnecting the three-dimensional memory chip package unit with the two-dimensional fan-out peripheral circuit chip SIP package unit by bonding the first metal bumps to the first surface of the third rewiring layer.

9. The method of packaging the fan-out stacked semiconductor package structure according to claim 8, wherein the method of forming the three-dimensional memory chip package unit further comprises:

laminating and bonding the first memory chip and the second memory chip sequentially on the first rewiring layer, wherein the first memory chip, the first bonding layer, the second memory chip and the second bonding layer are laminated in the stepped configuration; and performing wire bonding between the first bonding pad on the first memory chip and the first surface of the first rewiring layer, and between the second bonding pad on the second memory chip and the first surface of the first rewiring layer, to form the first and second wire bonding structures, respectively.

10. The method of packaging the fan-out stacked semiconductor package structure according to claim 8, wherein the laminating and bonding of the first memory chip and the second memory chip on the first surface of the first rewiring layer is realized by a surface mount process.

11. The method of packaging the fan-out stacked semiconductor package structure according to claim 8, wherein the method of forming the two-dimensional fan-out peripheral circuit chip SiP package unit further comprises:

electrically connecting the at least one peripheral circuit chip in the two dimensional arrangement to the first surface of the second rewiring layer, and electrically connecting one end of each of the metal connection pillars to the first surface of the second rewiring layer, and electrically connecting another end of each of the metal connection pillars with the second surface of the third rewiring layer, respectively;

wherein the second surface of the third rewiring layer is bonded to the at least one peripheral circuit chip, and wherein forming the metal connection pillars between the second surface of the third rewiring layer and the first surface of the second rewiring layer comprises applying a wire bonding technique.

12. The method of packaging the fan-out stacked semiconductor package structure according to claim 8, wherein forming the three-dimensional memory chip package unit further comprises:

forming a third memory chip and a third bonding layer under the third memory chip stacked on a third step of the stepped configuration, wherein the third step is arranged to be above and retreated from the second step of the stepped configuration, wherein a third bonding pad is arranged on a surface of the third memory chip on the third step of the stepped configuration; and forming a third wire bonding structure, wherein one end of the third wire bonding structure is electrically connected to the third bonding pad of the third memory chip and another end connects to the first surface of the first rewiring layer;

wherein the first encapsulating layer further encapsulates the third memory chip and the third wire bonding structure.

* * * * *